United States Patent [19]

Shvartsman

[11] Patent Number: 4,692,710

[45] Date of Patent: Sep. 8, 1987

[54] FUNDAMENTAL AND HARMONIC PULSE-WIDTH DISCRIMINATOR

[75] Inventor: Vladimir A. Shvartsman, Louisville, Ky.

[73] Assignee: Electronic Design & Research, Inc., Louisville, Ky.

[21] Appl. No.: 772,471

[22] Filed: Sep. 4, 1985

[51] Int. Cl.⁴ .............................................. H03K 9/08
[52] U.S. Cl. .................................... 328/111; 307/234; 307/265; 328/58
[58] Field of Search ................. 328/111, 112, 113, 58; 307/234, 265

[56] References Cited

U.S. PATENT DOCUMENTS

| | | | |
|---|---|---|---|
| 3,537,001 | 10/1970 | Friend | 324/78 |
| 3,629,710 | 12/1971 | Durland | 307/265 |
| 3,696,293 | 10/1972 | Hoffman et al. | 324/78 |
| 3,790,881 | 2/1974 | Smith | 328/112 |
| 3,949,199 | 4/1976 | Odom | 307/234 |
| 3,961,271 | 6/1976 | Zlydak et al. | 328/111 |
| 3,999,136 | 12/1976 | O'Berry et al. | 328/138 |
| 4,004,236 | 1/1977 | Cardon et al. | 328/138 |
| 4,012,981 | 3/1977 | Nagaitama | 307/265 |
| 4,232,267 | 11/1980 | Hanajima et al. | 328/138 |
| 4,275,354 | 6/1981 | Suematsu et al. | 328/112 |
| 4,486,752 | 12/1984 | Chihak | 307/234 |

OTHER PUBLICATIONS

V. G. Hansen, "Studies of Logarithmic Radar Receiver Using Pulse-Length Discrimination," IEEE Transactions on Aerospace and Electronic Systems, vol. AES-1, No. 3, Dec. 1965, pp. 246-253.

S. Sarpangal, "Build a Pulse-Width Detector with a 555 Timer," EDN Magazine, Oct. 5, 1977, p. 93.

Primary Examiner—John S. Heyman

Attorney, Agent, or Firm—Banner, Birch, McKie & Beckett

[57] ABSTRACT

The pulse-width discrimination system receives an input pulse whose leading edge enables an oscillator. The oscillator outputs frequency pulses to a comparison counter which counts the frequency pulses and compares them to a predetermined value, representing a minimum pulse width in which the user is interested. If the predetermined value is reached, the comparison counter triggers a tolerance window network which outputs a pulse, whose width represents the tolerance window, to one input of a coincidence output network. The input pulse is also received by a trailing-edge detector, which outputs a pulse to another input of the coincidence output network upon detection of the input pulse's trailing edge. If the input pulse's trailing edge coincides with the tolerance window, the coincidence output network will output an indication signal. Regardless of coincidence, the trailing edge of the input pulse disenables the oscillator, and the comparison counter is reset by the trailing-edge detector's output pulse. The oscillator is enabled for the length of the input pulse, and the comparison counter, which counts the oscillator frequency pulses, resets to an initial value every time it reaches a predetermined value. As the predetermined value represents the minimum pulse width, the comparison counter triggers the tolerance window network every minimum pulse-width duration, and harmonics thereof. Accordingly, the pulse-width discrimination system of the present invention will discriminate all pulses whose width is within the tolerance window of the fundamental pulse duration, or harmonics thereof.

The pulse-width discrimination system can also be configured to detect only pulses whose width is within the fundamental pulse duration, disregarding harmonics thereof.

28 Claims, 7 Drawing Figures

FUNDAMENTAL AND HARMONIC PULSE-WIDTH DISCRIMINATOR

BACKGROUND OF THE INVENTION

1. Technical Field

The present invention relates to pulse-width detection, and more particularly to pulse-width discrimination, that is, detection of pulses whose widths are at least as wide as a predetermined minimum pulse width, but within an allowable tolerance window.

2. Background Information

Pulse-width discrimination devices compare the width of an input pulse to a predetermined minimum pulse width, and output an indication signal only if the width of the input pulse is at least as wide as the minimum pulse width. The input pulse width must also fall within a predetermined tolerance window (permissible additional width variation from the minimum pulse width) before the indication signal is output. Thus, a pulse-width discriminator will output an indication signal only if the input pulse width is within the fundamental pulse duration (the minimum pulse width plus the tolerance window).

One method known in the art for generating the fundamental pulse duration is by using fixed delay lines to represent the minimum pulse width and the tolerance window. For example, "Studies of Logarithmic Radar Receiver Using Pulse-Length Discrimination" by Hansen, IEEE Transactions on Aerospace and Electronic Systems, Vol. AES-1, No. 3, Dec., 1965, pages 246–53, herein incorporated by reference, shows fixed delay lines comprising resistors, capacitors, and transistors. If the input pulse is within the tolerance window of the fundamental pulse duration, an indication signal is output. However, applications requiring adjustable pulse-width discrimination cannot use fixed delay lines, for they are difficult to adjust. Additionally, the use of resistors and capacitors in an RC network, although advantageous because of the high degree of accuracy attainable with precision RC components, are not advantageous for the discrimination of closely-spaced pulses. A major disadvantage exists due to the need to discharge the capacitor prior to discriminating subsequent pulses. Capacitor discharge time imposes a large dead time (the minimum interval, following a pulse, during which the circuit is not capable of repeating a specified function) which hinders the discrimination of pulses occuring during this dead time. Additionally, age, stress, and temperature deteriorate the RC network time interval accuracy.

Another method for generating minimum pulse widths is shown in an article entitled "Build a Pulse-Width Detector With a 555 Timer" by Sarpangal, EDN Magazine, Oct. 5, 1977, p. 93, herein incorporated by reference. Sarpangal configures an NE555 timer as a monostable multivibrator which is triggered by the leading edge of an input pulse. The timer generates a pulse width, representative of the minimum pulse width, by an RC network. If the input pulse width is wider than the minimum pulse width, the circuit outputs a pulse corresponding to the input pulse width less the minimum pulse width. Sarpangal thus is not concerned with a tolerance window, but rather the excess pulse duration following the minimum pulse width. Additionally, the use of the RC network to generate the minimum pulse width is not advantageous for the reasons stated above.

To overcome problems associated with both fixed delay line and RC networks, other systems have been developed. For example, U.S. Pat. No. 3,949,199 issued to Odom, herein incorporated by reference, describes a pulse-width decoder utilizing digital components to both set the minimum pulse width and tolerance windows, and reset the decoder. The minimum pulse width is set by a first counter network which counts pulses generated by an oscillator, the oscillator being enabled by the input pulse. If the input pulse is longer than the minimum pulse width, subsequent oscillator pulses are counted by a second counter network which outputs a pulse to a multi-stage shift register every N oscillator pulses. N determines the tolerance window, and the shift register output determines the harmonic of the tolerance window. For example, if the output is at the second stage of the shift register, the input pulse width is at least the minimum pulse width, and between 2N and 3N in width. Thus, the input pulse width can be resolved to an N tolerance window, provided that the input pulse width does not exceed N times the number of stages of the shift register. To expand the maximum pulse width receivable, Odom includes a feedback network between the shift register outputs and the second counter network which increases the value of N as the output stage increases. The trailing edge of the input pulse disenables the oscillator and causes additional circuitry to reset the counters and shift register. Accordingly, Odom detects pulses having at least a minimum width, and indicates the width of the input pulse according to the harmonic of the tolerance window.

Although Odom overcomes the problems associated with the dead time inherent in RC networks, Odom cannot accurately determine the width of a pulse except within the range of N multiplied by the oscillator frequency. Also, the width of any detectable pulse must fall within a range of N multiplied by the number of stages of the shift register. Accordingly, if N is large, the pulse-width accuracy is poor; if N is small, the maximum pulse-width detectable is small. Additionally, although the window range (N) is variable, changing one window range automatically changes the pulse-width detection range for all subsequent tolerance windows, for the window ranges are contiguous. Furthermore, fundamental pulse durations and harmonies thereof are not detected. Rather, tolerance window harmonics, after an initial minimum pulse width is satisfied, are detected.

SUMMARY OF THE INVENTION

Accordingly, it is an object of the present invention to discriminate a pulse whose width is at least a minimum pulse width and within a tolerance window, wherein the minimum pulse width and tolerance window define a fundamental pulse duration.

Additionally, it is an object of the present invention to discriminate a pulse whose width is within the tolerance window of a harmonic of a fundamental pulse duration.

It is also an object of the present invention to accurately discriminate a pulse whose width is within the tolerance window of a fundamental pulse duration, wherein the tolerance window is adjustable.

It is additionally an object of the present invention to discriminate a pulse whose width is within the tolerance window of a fundamental pulse duration harmonic, wherein the tolerance window is adjustable, and wherein adjusting the tolerance window does not interfere with the fundamental pulse duration or any harmonic thereof.

It is further an object of the present invention to indicate whether the discriminated pulse was discriminated during the fundamental pulse duration or during a harmonic thereof.

It is further still an object of the present invention to tally any discriminated pulse.

In addition, it is an object of the present invention to disregard a present input pulse and to reset the pulse-width discrimination system of the present invention to an initial state upon user-command.

According to the objects of the present invention, the pulse-width discrimination system receives an input pulse whose leading edge enables an oscillator. The oscillator outputs frequency pulses to a comparison counter which counts the frequency pulses and compares them to a predetermined value, representing a minimum pulse width in which the user is interested. If the predetermined value is reached, the comparison counter triggers a tolerance window network which outputs a pulse whose width represents the tolerance window, to one input of a coincidence output network. The input pulse is also received by a trailing-edge detector, which outputs a pulse to another input of the coincidence output network upon detection of the input pulse's trailing edge. If the input pulse's trailing edge coincides with the tolerance window, the coincidence output network will output an indication signal. Regardless of coincidence, the trailing edge of the input pulse disenables the oscillator, and the comparison counter is reset by the trailing-edge detector's output pulse.

The oscillator is enabled for the length of the input pulse, and the comparison counter, which counts the oscillator frequency pulses, resets to an initial value every time it reaches a predetermined value. As the predetermined value represents the minimum pulse width, the comparison counter triggers the tolerance window network every minimum pulse width duration, or harmonics thereof. Accordingly, the pulse-width discrimination system of the present invention will discriminate all pulses whose width is within the tolerance window of the fundamental pulse duration, or harmonics thereof.

The system can also output a signal indicating which harmonic has been discriminated. This is accomplished by counting the comparison counter's trigger pulses (indicating each minimum pulse width duration) and outputting this value to the user, either when an input pulse is discriminated, or without regard to pulse discrimination, depending upon user application. When harmonics of the fundamental pulse duration are detected, it is preferred that the tolerance window be less than or equal to the minimum pulse width, so as not to overlap or in any way interfere with the fundamental pulse duration or any harmonic thereof.

The pulse-width discrimination system of the present invention can also be configured to detect only the fundamental pulse duration. When the minimum pulse width has been reached, the comparison counter triggers the tolerance window network, which outputs the tolerance window pulse, and triggers a leading edge detector, which disenables the oscillator and resets the comparison counter. The leading-edge detector initially enables the oscillator upon detection of the input pulse's leading edge. (The trailing edge of the input pulse does not affect the oscillator enable, for only leading edges affect the leading edge detector.) Thus, only pulses within the tolerance window of the fundamental pulse durations are discriminated. Accordingly, the tolerance window can be any duration with respect to the minimum pulse width, for no interference of overlap is possible.

The pulse-width discrimination system of the present invention can also be configured to disregard a present input pulse upon user-command. A reset pulse is generated by conventional means, disenabling the oscillator and resetting the comparison counter, thereby terminating the discrimination of the present input pulse.

Tally counters can optionally be included to count the number of input pulses discriminated by the system. If harmonics are detected, counters can be placed either at each harmonic indicator, or collectively, depending on user application.

DESCRIPTION OF THE PREFERRED EMBODIMENTS

Figure 1:
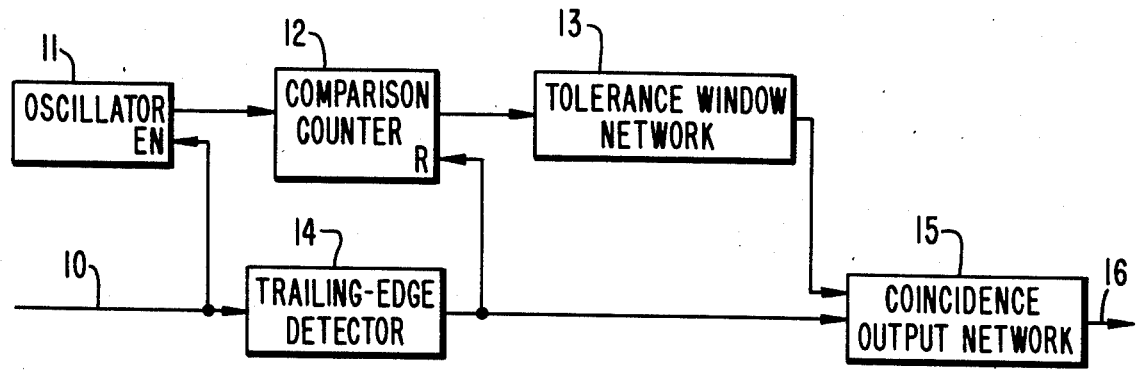
FIG. 1 is a simplified block diagram of the pulse-width discrimination system for discriminating pulses within the tolerance window of the fundamental pulse duration and harmonics thereof.

FIG. 1 is a simplified block diagram of the pulse-width discrimination system for discriminating pulses within the tolerance window of the fundamental pulse duration and harmonics thereof.

An input pulse is applied at line 10, enabling oscillator 11 to output a train of pulses to comparison counter 12. Oscillator 11 can be any device for producing accurately-spaced frequency pulses, such as a crystal oscillator, voltage-controlled oscillator, square-wave generator, or the like. In the preferred embodiment, oscillator 11 is a crystal-based, voltage-controlled oscillator, thereby allowing the user to easily adjust the oscillation frequency.

Comparison counter 12 counts the frequency pulses from oscillator 11 and outputs a pulse to tolerance window network 13 when it reaches a predetermined value. This predetermined value represents the minimum pulse width which the user wishes to detect. Accordingly, the oscillator frequency multiplied by the predetermined value equals the minimum pulse width in which the user is interested. Comparison counter 12 can be a resettable divide-by-N counter, an up-counter configured to reset to zero upon reaching the predetermined value, a down-counter configured to reset to the predetermined value upon reaching zero, or a counter/comparator network which counts the frequency pulses from oscillator 11 and resets when the counter reaches the predetermined value, stored in memory means and connected to the comparator. In the preferred embodiment, comparison counter 12 is an up-counter which resets to zero upon reaching the predetermined value.

When comparison counter 12 reaches the predetermined value, its output pulse triggers tolerance window network 13, which outputs a pulse to one input of coincidence output network 15. The duration of the output pulse from tolerance window network 13 is the duration of the tolerance window. Tolerance window network 13 can be any conventional device which outputs a predetermined pulse width upon being triggered. In the preferred embodiment, the tolerance window network 13 is a monostable multivibrator, setting and adjusting the pulse width being well-known to those skilled in the art.

The input pulse is also input to trailing-edge detector 14. The trailing edge of the input pulse triggers trailing-edge detector 14, which outputs a pulse to the other input of coincidence output network 15. Trailing-edge detector 14 can be any conventional device which outputs a predetermined pulse width upon being triggered. In the preferred embodiment, trailing-edge detector 14 is a monostable multivibrator chosen to generate a very short output pulse, as will become obvious below. The output pulse from trailing-edge detector 14 also resets comparison counter 12.

If outputs from tolerance window network 13 and trailing-edge detector 14 coincide, coincidence output network 15 will output an indication signal on output line 16. Coincidence output network 15 can be any device which outputs a signal if pulsed coincidentally. In the preferred embodiment, network 15 is an AND gate. Accordingly, the output signal on line 16 will be the duration of the trailing-edge detector's pulse width ANDed to the tolerance window network's pulse width. Regardless of coincidence, the system will be reset and wait to discriminate another input pulse. The output pulse can optionally be varied by pulse-width varying means, such as a monostable multivibrator, allowing the output pulse to be any width other than the width of coincidence of the two pulses.

After the trailing edge of the input pulse has passed through the system, there is a short dead time (a minimum interval, following an input pulse, during which the system is incapable of discrimination) which is equal to the reaction time of trailing-edge detector 14 added to the duration of the pulse generated therefrom. The dead time is calculated from the following equation:

$$T_d = T_{plh} + T_{pw} + T_{phl}$$

wherein:

$T_d$ = dead time;
$T_{plh}$ = propagation delay time, low-to-high output;
$T_{pw}$ = pulse-width; and
$T_{phl}$ = propagation delay time, high-to-low output.

Accordingly, trailing-edge detector 14 is chosen to generate as short a pulse duration as possible in order to minimize dead time. In the preferred embodiment, the trailing-edge detector output pulse equals the comparison counter reset time.

The pulse-width discrimination system of FIG. 1 discriminates all pulses within the tolerance window of the fundamental pulse duration and harmonics thereof. This is because comparison counter 12, upon reaching the predetermined value and outputting a pulse to tolerance window network 13, resets to an initial value and continues to count the frequency pulses output from oscillator 11. As oscillator 11 is enabled for the input pulse duration, comparison counter 12 also triggers tolerance window network 13 every harmonic of the minimum pulse width. If the trailing edge of the input pulse corresponds to any tolerance window generated by network 13, coincidence output network 15 will output an indication signal on line 16.

When detecting harmonics of the fundamental pulse duration, it will be appreciated that, although the duration of the tolerance window can be any width value, it is preferable to restrict the tolerance window to less than or equal to the minimum pulse width. In this way, the tolerance window duration does not overlap or in any way interfere with the fundamental pulse duration or any harmonic thereof.

Figure 2:
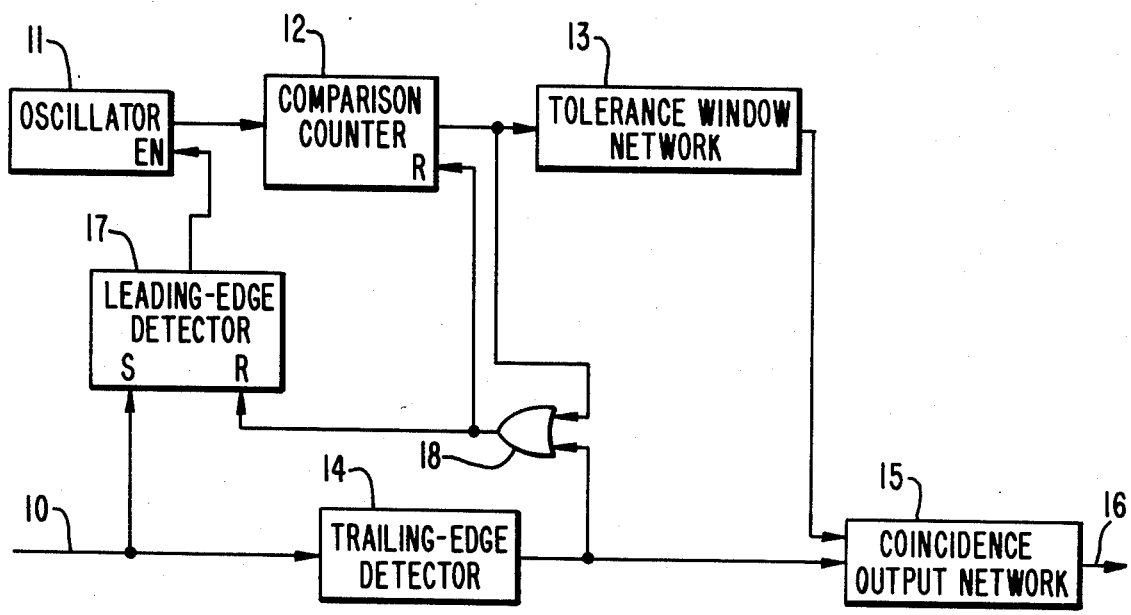
FIG. 2 is a simplified block diagram of the pulse-width discrimination system for discriminating pulses only within the tolerance window of the fundamental pulse duration.

Turning now to FIG. 2, a pulse-width discrimination system is shown which discriminates only pulses within the tolerance window of the fundamental pulse duration. In order to modify FIG. 1 so that the system disregards harmonics, comparison counter 12 must be reset to its initial position either after the first minimum pulse width has been reached, or at the end of the input pulse, whichever occurs first. Additionally, frequency pulses from oscillator 11 must be disconnected from comparison counter 12 at this point so that comparison counter 12 does not deviate from its initial position until the beginning of the next input pulse. Although other circuitry will be obvious to one skilled in the art based on the above requirements, the preferred embodiment of the pulse-width discrimination system for discriminating only pulses within the tolerance window of the fundamental pulse duration is shown in FIG. 2.

As shown in FIG. 2, leading-edge detector 17 enables oscillator 11 upon receipt of the leading edge of the input pulse at line 10. (Alternatively, it is possible to enable the comparison counter with the leading-edge detector, allowing the oscillator to continuously output frequency pulses.) As described above with reference to FIG. 1, comparison counter 12 counts the frequency pulses output from oscillator 11, and outputs a trigger pulse to tolerance window network 13 upon reaching the predetermined value. The trigger pulse from comparison counter 12 is also input to one input of OR gate 18, resetting comparison counter 12 and disenabling oscillator 11 by resetting detector 17. Detector 17 can be any settable/resettable device, such as a J-K flip-flop, an R-S latch, or the like. In the preferred embodiment, detector 17 is a J-K flip-flop.

If the input pulse width is less than the minimum pulse width, the trailing edge of the input pulse triggers trailing-edge detector 14, which outputs a pulse to the other input of OR gate 18, resetting comparison counter 12 and disenabling oscillator 11. Aside from not detecting harmonics, the system shown in FIG. 2 operates identically to the system shown in FIG. 1. However, as harmonics are not being detected, the pulse-width output from tolerance window network 13 can be adjusted to any width relative to the minimum pulse width, for the tolerance window width will not interfere with the minimum pulse width of the fundamental pulse duration.

Discussing FIGS. 1 and 2 generally, the fundamental pulse duration (minimum pulse width plus tolerance window) can be adjusted several ways, including adjusting the clock frequency of oscillator 11, the predetermined value of comparison counter 12, or the pulse width output by tolerance window network 13. The adjustment choice is application dependent. For example, to provide longer minimum pulse widths, the predetermined value of comparison counter 12 can be increased; to adjust the tolerance window, the pulse width from network 15 can be adjusted; to proportionally adjust the minimum pulse width and the tolerance window, the oscillator clock frequency can be adjusted.

Figure 3:
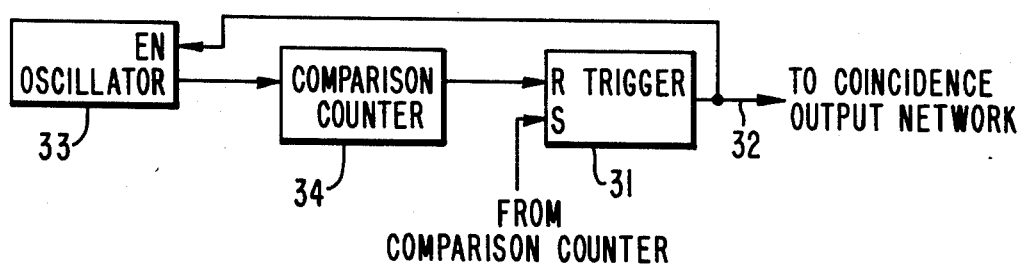
FIG. 3 is a simplified block diagram of an embodiment of the tolerance window network shown in FIGS. 1 and 2.

Applications exist where the required tolerance window cannot be obtained from conventional multivibrators. FIG. 3 is a simplified block diagram of an adjustable tolerance window network, available when the required tolerance window cannot be obtained from conventional multivibrators. The tolerance window network of FIG. 3 can replace the tolerance window network 13 of FIG. 1 or 2.

Trigger 31 receives a pulse from comparison counter 12, and outputs the leading edge of the tolerance window pulse at line 32. The tolerance window pulse goes to the coincidence output network. Trigger output 32 also enables oscillator 33, which outputs frequency pulses to comparison counter 34. The frequency pulses are counted by comparison counter 34 and, at a predetermined value indicative of the tolerance window width, outputs a pulse to trigger 31. This pulse resets trigger 31, causing the trailing edge of the tolerance window pulse to be output on line 32, thereby disenabling oscillator 33. The enable (line 32) can alternatively enable the comparison counter, allowing the oscillator to continuously output frequency pulses. By enabling counters 34 and 12 (FIG. 1), oscillators 33 and 11 (FIG. 1) can be integrated. Trigger 31 can be an R-S latch, a J-K flip-flop, or a similar controllable switching device and, in the preferred embodiment, trigger 31 is a J-K flip-flop. Comparison counter 31 can be any device described with reference to comparison counter 12 and, in the preferred embodiment, comparison counter 31 is a programmable divide-by-N counter. Oscillator 33 can be any device described with reference to oscillator 11 and, in the preferred embodiment, oscillator 33 is a crystal-based voltage-controlled oscillator, allowing the oscillation frequency to be easily changed.

Figure 4:
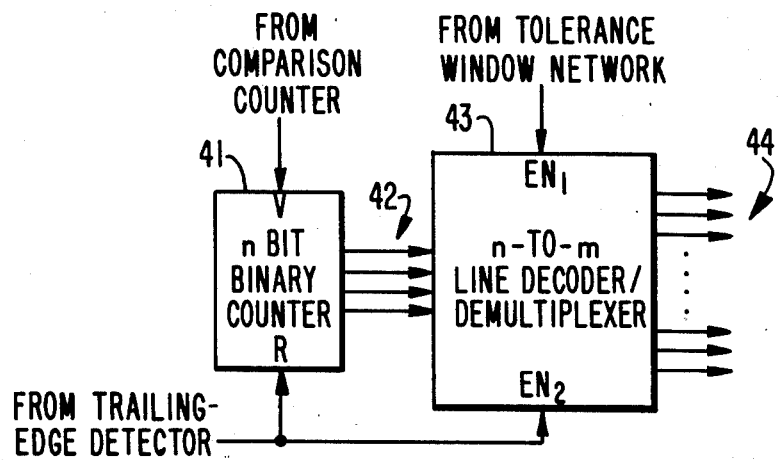
FIG. 4 is a simplified block diagram of an embodiment of the coincidence output network, shown in FIG. 1, for specifying the harmonic of the fundamental pulse duration which was discriminated.

Certain applications require knowledge of the harmonic pulse duration discriminated by the pulse-width discriminator of the present invention. FIG. 4 is a simplified block diagram of a coincidence output network for specifying which harmonic of the fundamental pulse duration was discriminated.

As shown in FIG. 4, n-bit binary counter 41 is incremented every minimum pulse width by the output from comparison counter 12 (FIG. 1). The binary counter value 42 is decoded by n-to-m line decoder/demultiplexer 43 into m output lines 44. Decoder 43 outputs a signal onto one of m output lines 44 only when enabled coincidentally by the tolerance window pulse from the tolerance window network (13 of FIG. 1 or line 32 of FIG. 3) and the trailing edge of the input pulse (via trailing-edge detector 14). If the trailing edge of the input pulse does not correspond to the tolerance window of the fundamental pulse duration, no output is seen on any of lines 44. Regardless, the trailing edge of the input pulse resets binary counter 41 via trailing-edge detector 14. In the preferred embodiment, binary counter 41 is a 4-bit binary counter, and decoder 43 is a 4-to-16 line decoder/demultiplexer, allowing the pulse-width discriminator to detect a series of 16 harmonics of the fundamental pulse duration. Modifications to FIG. 4 will be obvious to one skilled in the art, and will be application-dependent. For example, a decade counter and controllable outputs can replace binary counter 41 and line decoder 43, respectively, for detecting a series of 10 harmonics. Additionally, counter 41 can be configured to reset after reaching a value less than its maximum value, allowing for a wide range of harmonic series detection.

Applications exist where the duration of the input pulse will extend beyond the harmonic duration of binary counter 41. The harmonic detector of FIG. 4 will continue to detect harmonics beyond 16, recirculating output lines 44, since comparison counter 12 and binary counter 41 recirculate. Should the user desire knowledge of the super-harmonic (the multiple of the 16-harmonic pulse duration), super-harmonic detection circuitry (not shown) can be included. For example, a super-harmonic counter is incremented whenever the harmonic counter (i.e., binary counter 41) resets to its initial value. The harmonic counter reset is detected, for example, by the ripple-carry-output of the harmonic counter. The super-harmonic counter is reset by the trailing edge of the input pulse by trailing-edge detector 14. Contents of the super-harmonic counter can be controllably output simultaneously with decoder outputs 44 (using decoder 43 enabling lines). Alternatively, contents of the super-harmonic counter can be output regardless of coincidence, depending upon user application. Additionally, the super-harmonic counter contents can be decoded or not, depending on user application.

Figure 5:
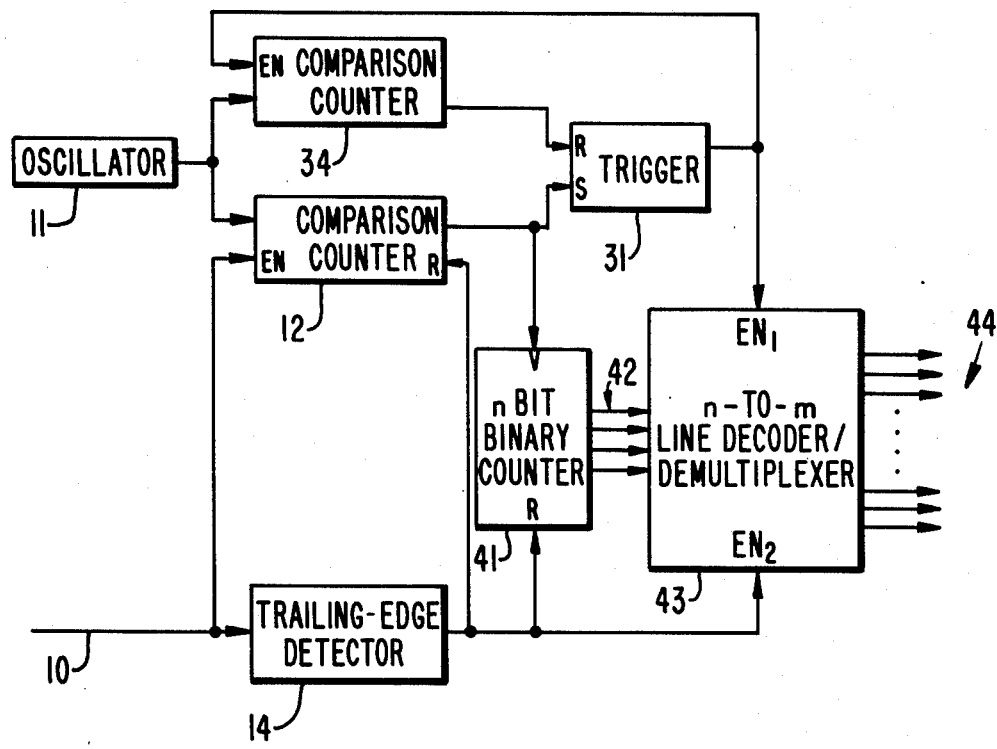
FIG. 5 is a simplified block diagram of the pulse-width discrimination system of FIG. 1 incorporating a version of the tolerance window network of FIG. 3 and the harmonic specifier of FIG. 4.

Turning now to FIG. 5, a simplified block diagram of the pulse-width discrimination system of FIG. 1 is shown with a version of the tolerance window network of FIG. 3 and the harmonic specifier of FIG. 4.

Input pulse on line 10 enables comparison counter 12, allowing frequency pulses from oscillator 11 to be counted. When the predetermined value of comparison counter 12 (representative of the minimum pulse width) is reached, counter 12 outputs a pulse incrementing binary counter 41 and setting trigger 31. Trigger 31, upon being set, outputs the leading edge of the tolerance window pulse, enabling decoder 43 and comparison counter 34. Enabled comparison counter 34 counts the frequency pulses from oscillator 11 and, when the predetermined value of comparison counter 34 (representative of the tolerance window) is reached, counter 34 resets trigger 31, disabling decoder 43 and counter 34.

This cycle continues until the trailing edge of the input pulse is detected. Trailing-edge detector 14 outputs a pulse which resets comparison counter 12 and binary counter 41, and enables decoder 43. If the enable pulses from detector 14 and trigger 31 coincide, the harmonic detected by counter 41 and output on lines 42 is decoded by decoder 43 and output on the appropriate output line 44. If the enable pulses do not coincide, no output pulse appears on lines 44.

In the preferred embodiment, the predetermined value of comparison counter 12 is greater than or equal to that of comparison counter 34. This allows the tolerance window (set by counter 34) to be adjusted without overlapping or intersecting the minimum pulse width (set by counter 12). Accordingly, the tolerance window can be adjusted without affecting the fundamental pulse duration interval.

The super-harmonic network described with reference to FIG. 4 can be included in FIG. 5, should the applications require it. Additionally, other options and modifications can be incorporated into the present invention, as will now be described.

For example, a tally counter (not shown) can be placed at output line 18 (FIG. 1 or 2), or lines 44 (FIG. 4 or 5) collectively or separately, for counting the number of pulses discriminated by the pulse-width discrimination system of the present invention. The tally counter contents can be used in many ways, obvious to those skilled in the art. For example, in applications where random noise is discriminated, a histogram can be plotted illustrating harmonic distribution of noise occuring at the chosen threshold level. Additionally, the harmonic count can act as an error indication in situations where a pulse width should not exceed a predetermined width.

The circuitry of FIG. 5 can also be modified to function as a frequency counter. Output circuitry 41 and 43 would be replaced with a coincidence output network, such as an AND gate, which would output a signal at every pulse width (set by comparison counter 12) that fell within the tolerance window (set by comparison counter 34). Oscillator 11WI is adjusted to the desired frequency, or multiples thereof. The predetermined value of comparison counter 12 is user-controlled, and divides the oscillator frequency down to the user-interested frequency. Tolerances are set by comparison counter's 34 predetermined value. An accurate frequency discrimination is achieved, for the system rejects pulses not within the tolerance window of the fundamental pulse duration. A counting network and display could also be included to tabulate and record the number of pulses discriminated.

Another option is a user-controlled reset network (not shown) for resetting the pulse-width discrimination system. Reset pulse generators are well-known to those skilled in the art. For example, a user-controlled toggle switch/monostable multivibrator, momentary toggle switch, or other conventional user-controlled pulse generator means, is connected to one input of an OR gate, with the output of trailing-edge detector 14 connected to another OR gate input. The OR gate output is connected to the reset inputs of comparison counter 12 and binary counter 41, harmonic counter, and super-harmonic counter, if applicable. The OR gate output can also be input to a leading edge detector, integrated as shown in FIG. 2, thereby allowing the present input pulse to terminate without affecting the reset function. Reset capability for the discriminator of FIG. 2 requires only a reset pulse input at OR gate 18.

The pulse-width discrimination system of FIG. 5 detects a series of harmonics of a fundamental pulse duration. A specific embodiment for detecting 16 harmonics of a fundamental pulse duration is discussed in an article by the present inventor entitled "Perpetual Pulse-Width Counter Sorts 16 Pulse-Width Ranges", Computer Systems Equipment Design, Nov. 1984, pps. 50-51, herein incorporated by reference.

A wide range of other applications following the teaching of the present invention also exist. In addition to those applications discussed above, the present invention can also be applied to data communication systems, such as computer to input/output devices, telephone communications, and the like.

Figure 6:
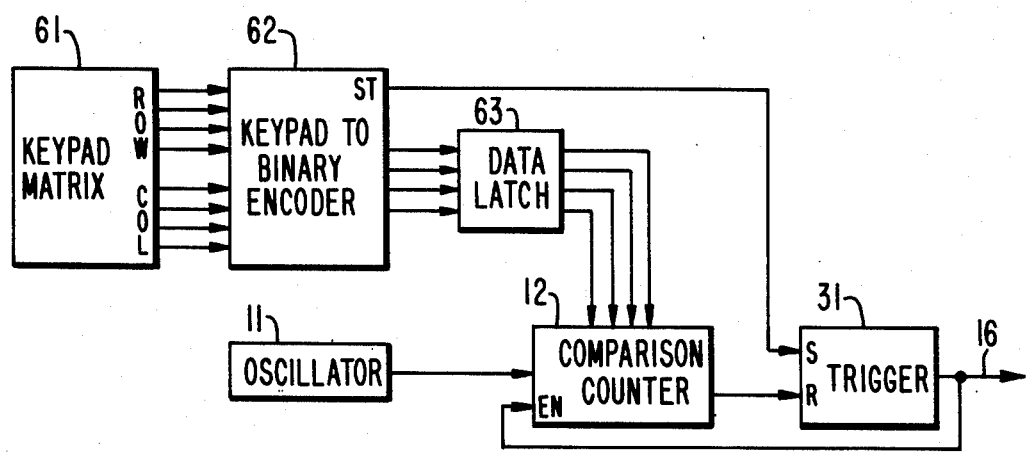
FIG. 6 is a simplified block diagram of a pulse-width encoder for encoding keypad data.
Figure 7:
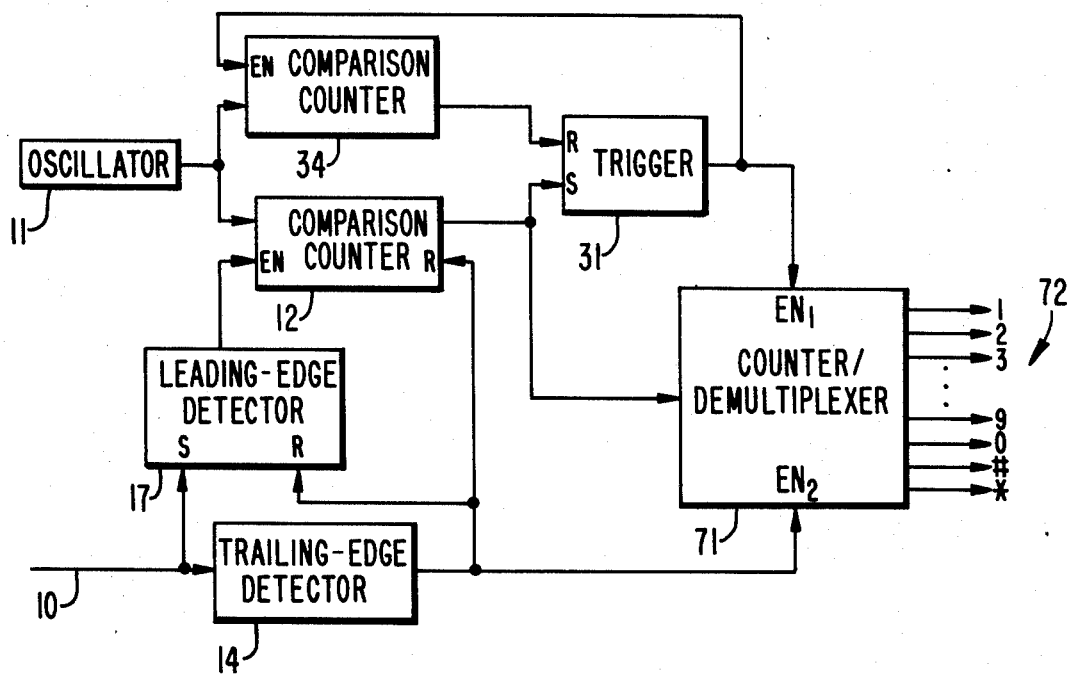
FIG. 7 is a simplified block diagram of a pulse-width decoder for decoding pulses generated by the encoder of FIG. 6.

For example, turning now to FIG. 6, a keypad encoder for encoding a unique pulse width for a unique data entry is shown, and a decoder for decoding the unique pulse width is shown in FIG. 7. As shown in FIG. 6, a keypad encoder outputs a unique pulse width representing the key depressed. Keypad 61 can have any matrix configuration, such as alphanumeric, decimal, hexidecimal, or the like. In the preferred embodiment, keypad 61 is a 3×4 matrix having the 12 pushbuttom telephone keyboard symbols.

Row and column data are output from keypad matrix 61 to keypad-to-binary encoder 62 upon depression of any key. Encoder 62 outputs a binary representation of the row and column data to data latch 63, which sets a predetermined value, unique to the specific key depressed, in comparison counter 12. The strobe output of encoder 62 sets trigger 31, which outputs the leading edge of the unique pulse width at output line 16. The output pulse enables comparison counter 12 to count the frequency pulses from oscillator 11 and trigger 31 is reset when counter 12 reaches the predetermined value. Accordingly, the encoder of FIG. 6 generates a pulse of a unique width for each key depressed.

The encoded keypad data is decoded by the circuit shown in FIG. 7. The input pulse duration is determined by comparison counter 12, as discussed above. Counter/demultiplexer 71 counts the minimum pulse duration harmonies and outputs a pulse on appropriate output line 72 when the trailing edge of the input coincides with the tolerance window. The pulse-width encoder and decoder have high noise-rejection capabilities, offering a substantial improvement over frequency-based keypad encoders and decoders.

The decoder of FIG. 7 can be modified to include an automatic reset if the width of the input pulse is wider than the acceptable width of the last character (i.e., "*"). The automatic reset capability, in the preferred embodiment, is achieved by connecting the ripple-carry-output (RCO) of counter/demultiplexer 71 to the reset line of leading-edge detector 17 and counter 12 (not shown).

Other modifications and options can be included without deviating from the basic teachings of the pulse-width discrimination system described herein. Accordingly, it is to be understood that, although illustrative embodiments of the present invention have been described in detail with reference to the accompanying drawings, the present invention is not limited to those precise embodiments. Various changes or modifications may be effected therein by one skilled in the art without departing from the scope or spirit of the invention.

What I claim is:

1. A device for indicating whether an input pulse, having a leading edge, an unknown width, and a trailing edge, is at least as wide as a predetermined minimum pulse width and within a predetermined tolerance window, said device comprising:

first oscillator means, enabled by the leading edge of the input pulse, for outputting pulses at a first frequency;

first comparison counter means, coupled to said first oscillator means, for counting said first frequency pulses, comparing said first frequency pulse count to a first predetermined value representative of the minimum pulse width, and outputting a trigger pulse when said first frequency pulse count reaches said first predetermined value;

tolerance window means, coupled to said first comparison counter means, for receiving said trigger pulse and outputting a pulse having a first pulse-width duration representative of the tolerance window;

trailing-edge detector means, enabled by the trailing edge of the input pulse, for outputting a pulse having a second pulse-width duration; and coincidence output means, having a first input coupled to said tolerance window means and a second input coupled to said trailing-edge detector means, for outputting a pulse having a third pulse-width duration when said first pulse-width duration and said second pulse-width duration are in coincidence.

2. The device of claim 1 further comprising:
tally means, coupled to said coincidence output means, for tabulating the number of said third pulse-width durations.

3. The device of claim 1 wherein said third pulse-width duration is substantially equal to the time duration when said first pulse-width duration and said second pulse-width duration are in coincidence.

4. The device of claim 1 wherein said third pulse-width duration is substantially different than the time duration when said first pulse-width duration and said second pulse-width duration are in coincidence.

5. The device of claim 4 wherein said coincidence output means comprises:
an AND gate having said first and said second inputs; and
pulse-width varying means, coupled to the output of said AND gate, for outputting said pulse having said third pulse-width duration.

6. The device of claim 1 wherein said second pulse-width duration is less than said first pulse-width duration.

7. The device claim 1 wherein said first comparison counter means is resettable to an initial value when said first frequency pulse count reaches said first predetermined value.

8. The device of claim 7 wherein said first comparison counter means is further resettable to the initial value upon receiving an external reset pulse.

9. The device of claim 8 wherein said external reset pulse is the output pulse from said trailing-edge detect means, a user-activated reset pulse, or said trigger pulse from said first comparison counter means.

10. The device of claim 9 further comprising:
leading-edge detector means, having a first input coupled to the input pulse, for enabling said first oscillator means upon detection of the leading edge of the input pulse, and having a second input, coupled to said external reset pulse, for disabling said first oscillator means upon detection of said external reset pulse.

11. The device of claim 1 wherein said tolerance window means comprises:
trigger means, enabled by said trigger pulse, for outputting said pulse having said first pulse-width duration;
second oscillator means, enabled by said pulse having said first pulse-width duration, for outputting pulses at a second frequency; and
second comparison counter means, coupled to said second oscillator means, for counting said second frequency pulses, comparing said second frequency pulse count to a second predetermined value representative of the tolerance window, and outputting a disenable pulse when said second frequency pulse count reaches said second predetermined value for disenabling said trigger means.

12. The device of claim 1 wherein said first pulse-width duration, representative of the tolerance window, is less than or equal to the minimum pulse width, represented as said first predetermined value.

13. The device of claim 12 wherein said coincidence output means comprises:
harmonic counter means, coupled to said first comparison counter means, for counting said trigger pulses and outputting a signal representative of said trigger pulse count; and
harmonic controllable-output means, coupled to said harmonic counter means, for outputting the signal representative of said trigger pulse count as the pulse having said third pulse-width duration when said first pulse-width duration and said second pulse-width duration are in coincidence at said first and said second inputs, respectively.

14. The device of claim 13 wherein said harmonic counter means is resettable to an initial value when said trigger pulse count reaches a first predetermined count value.

15. The device of claim 14 wherein said harmonic counter means is further resettable to the initial value upon receiving an external reset pulse, wherein said external reset pulse is the output pulse from said trailing-edge detector means, or a user-activated reset pulse.

16. The device of claim 14 wherein said coincidence output means further comprises:
super-harmonic counter means, coupled to said harmonic counter means, for counting the number of occurrences when said harmonic counter resets to the initial value, and outputting a signal representative of said harmonic counter reset count.

17. The device of claim 16 wherein said super-harmonic counter means is resettable to an initial value when said harmonic counter reset count reaches a second predetermined count value and is further resettable to the initial value upon receiving an external reset pulse, wherein said external reset pulse is the output pulse from said trailing-edge detector means, or the user-activated reset pulse.

18. The device of claim 16 further comprising: super-harmonic controllable-output means, coupled to said super-harmonic counter means, for outputting the signal representative of said harmonic counter reset count when said first pulse-width duration and said second pulse-width duration are in coincidence.

19. A device for indicating whether an input pulse, having a leading edge, an unknown width, and a trailing edge, is at least as wide as a predetermined minimum pulse width and within a predetermined tolerance window, said device comprising:
oscillator means for outputting pulses at a constant frequency;
first comparison counter means, coupled to said oscillator means and enabled by the leading edge of the input pulse, for counting said frequency pulses, comparing said frequency pulse count to a first predetermined value representative of the minimum pulse width, and outputting a first trigger pulse when said frequency pulse count reaches said first predetermind value;
trigger means, coupled to said first comparison counter means, for outputting the leading-edge of a first enable pulse having a first pulse-width duration upon receipt of said first trigger pulse, and outputting the trailing edge of said first enable pulse upon receipt of a second trigger pulse, wherein said first enable pulse is representative of the tolerance window;

second comparison counter means, coupled to the output of said trigger means and said oscillator means and enabled by said first enable pulse, for counting said frequency pulses, comparing said frequency pulse count to a second predetermined value representative of the tolerance window, and outputting said second trigger pulse when said frequency pulse count reaches said second predetermined value;

trailing-edge detector means, enabled by the trailing edge of the input pulse, for outputting a second enable pulse having a second pulse-width duration; and counter output means, coupled to said first comparison counter means, for counting said first trigger pulses and outputting a signal representative of said first trigger pulse count when said first enable pulse and said second enable pulse are in coincidence.

20. The device of claim 19 wherein said second pulse-width duration is less than said first pulse-width duration.

21. The device of claim 19 wherein said first comparison counter means is resettable to an initial value when said frequency pulse count reaches said first predetermined value.

22. The device of claim 21 wherein said first comparison counter means is further coupled to the output of said trailing-edge detector means and is resettable to the initial value upon receipt of said second enable pulse.

23. The device of claim 19 further comprising:
leading-edge detector means, having a first input coupled to the input pulse, for enabling said first comparison counter means upon detection of the leading edge of the input pulse, and having a second input coupled to the output of said trailing-edge detector means, for disabling said first comparison counter means upon detection of said second enable pulse.

24. The device of claim 19 wherein said first pulse-width duration, representative of the tolerance window, is less than or equal to the minimum pulse width, represented as said first predetermined value.

25. The device of claim 19 wherein said counter output means is resettable to an initial value upon reaching a third predetermined value.

26. A device for generating a pulse having a unique pulse width based on a unique data entry, said device comprising:
data entry means for outputting a signal representative of the data;
data encoder means, coupled to said data entry means, for outputting a first trigger pulse, and for outputting a predetermined value representative of the data signal;
oscillator means for outputting pulses at a constant frequency;
comparison counter means having a first input, coupled to said data encoder means, for receiving said predetermined value, and having a second input, coupled to said oscillator means, for counting said frequency pulses, comparing said frequency pulse count to said predetermined value, and outputting a second trigger pulse when said frequency pulse count reaches said predetermined value; and
trigger means, having a first input coupled to said data encoder means for receiving said first trigger pulse, and having a second input coupled to said comparison counter means for receiving said second trigger pulse, for outputting the leading edge of the unique pulse width upon receipt of said first trigger pulse, and outputting the trailing edge of the unique pulse width upon receipt of said second trigger pulse.

27. The device of claim 26 wherein:
said data entry means comprises a keypad matrix having a plurality of rows, a plurality of columns, and a plurality of keys, wherein a key is located at an intersection of a row and a column and wherein the data is a key depression and said signal representative of the data is the specific row and column location of said key depressed; and
said data encoder means comprises a keypad-to-binary encoder means for outputting said specific row and column location as said predetermined value.

28. The device of claim 27 further comprising:
latch means, coupled to said keypad-to-binary encoder means, for outputting said predetermined value for a duration longer than the duration that said predetermined value is output from said keypad-to-binary encoder means.

* * * * *